(12) United States Patent
Gamo (10) Patent No.: US 6,466,106 B1
(45) Date of Patent: Oct. 15, 2002

(54) PIEZOELECTRIC FILTER DEVICE WITH A GROUND ELECTRODE THAT IS NOT CENTERED IN THE THICKNESS DIRECTION OF THE FILTER

(75) Inventor: Masao Gamo, Takaoka (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/656,105

(22) Filed: Sep. 6, 2000

(30) Foreign Application Priority Data

Sep. 7, 1999 (JP) ............................................. 11-253112

(51) Int. Cl.⁷ .............................. H03H 9/58; H03H 9/15
(52) U.S. Cl. ......................... 333/189; 333/187; 310/366
(58) Field of Search ................................. 333/186–192; 310/320, 366

(56) References Cited

U.S. PATENT DOCUMENTS

| 5,065,066 A | * 11/1991 | Nakatani et al. ............. 310/320 |
| 5,084,647 A | * 1/1992 | Inoue et al. ............ 310/366 X |
| 5,274,293 A | * 12/1993 | Inoue et al. ................. 310/320 |
| 5,294,860 A | * 3/1994 | Gamo ......................... 310/320 |
| 5,444,326 A | * 8/1995 | Yoshida .................. 310/320 X |

FOREIGN PATENT DOCUMENTS

| JP | 3-97314 | * 4/1991 | ................. 333/191 |
| JP | 5-259805 | * 10/1993 | ............. 333/187 R |

* cited by examiner

*Primary Examiner*—Robert Pascal
*Assistant Examiner*—Barbara Summons
(74) *Attorney, Agent, or Firm*—Keating & Bennett, LLP (57) ABSTRACT

A first piezoelectric filter and a second piezoelectric filter are electrically connected to each other with a relay capacitor interposed therebetween. When the thicknesses of the piezoelectric substrate plates of the first and second piezoelectric filters are T1 and T2, respectively, and when the distances between the first main surfaces of the first and second piezoelectric filters and their corresponding adjacent ground electrodes are respectively $ta_1$ and $ta_2$, and when the distances between the second main surfaces of the first and second piezoelectric filters and their corresponding adjacent ground electrodes are respectively $tb_1$ and $tb_2$, the following relationships are satisfied: $tb_1-ta_1$ is 0 to 0.1 T1, $tb_2-ta_2$ is 0 to 0.1 T2, alternatively, $tb_1-ta_1$ is $-0.1$ T1 to 0, $tb_2-ta_2$ is 0.1 T2 to 0.

17 Claims, 11 Drawing Sheets

Fig. 11

PIEZOELECTRIC FILTER DEVICE WITH A GROUND ELECTRODE THAT IS NOT CENTERED IN THE THICKNESS DIRECTION OF THE FILTER

BACKGROUND OF THE INVENTION

1. Field of the Invention

The present invention relates to an energy trap type piezoelectric filter device using a second harmonic wave of a thickness-extension vibration mode. In particular, the present invention relates to a piezoelectric filter device having a structure including two piezoelectric filters, which are electrically connected to each other via a relay capacitor.

2. Description of the Related Art

Figure 10:
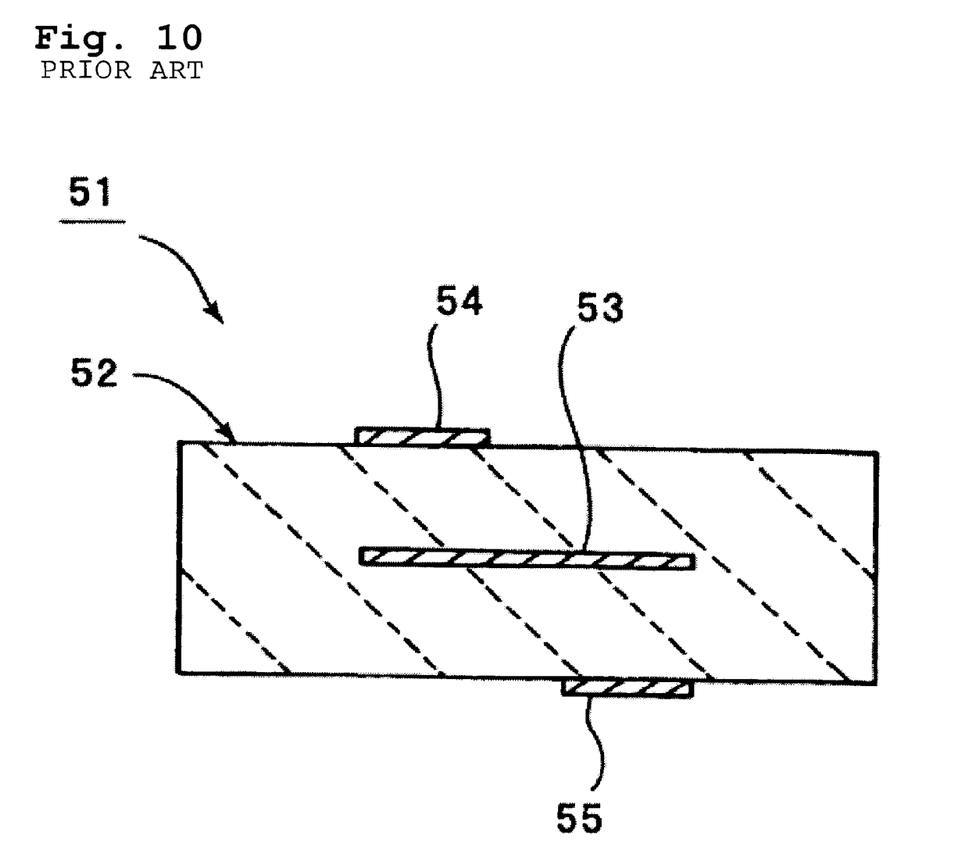
FIG. 10 is a sectional view illustrating one example of a conventional piezoelectric filter.
Figure 11:
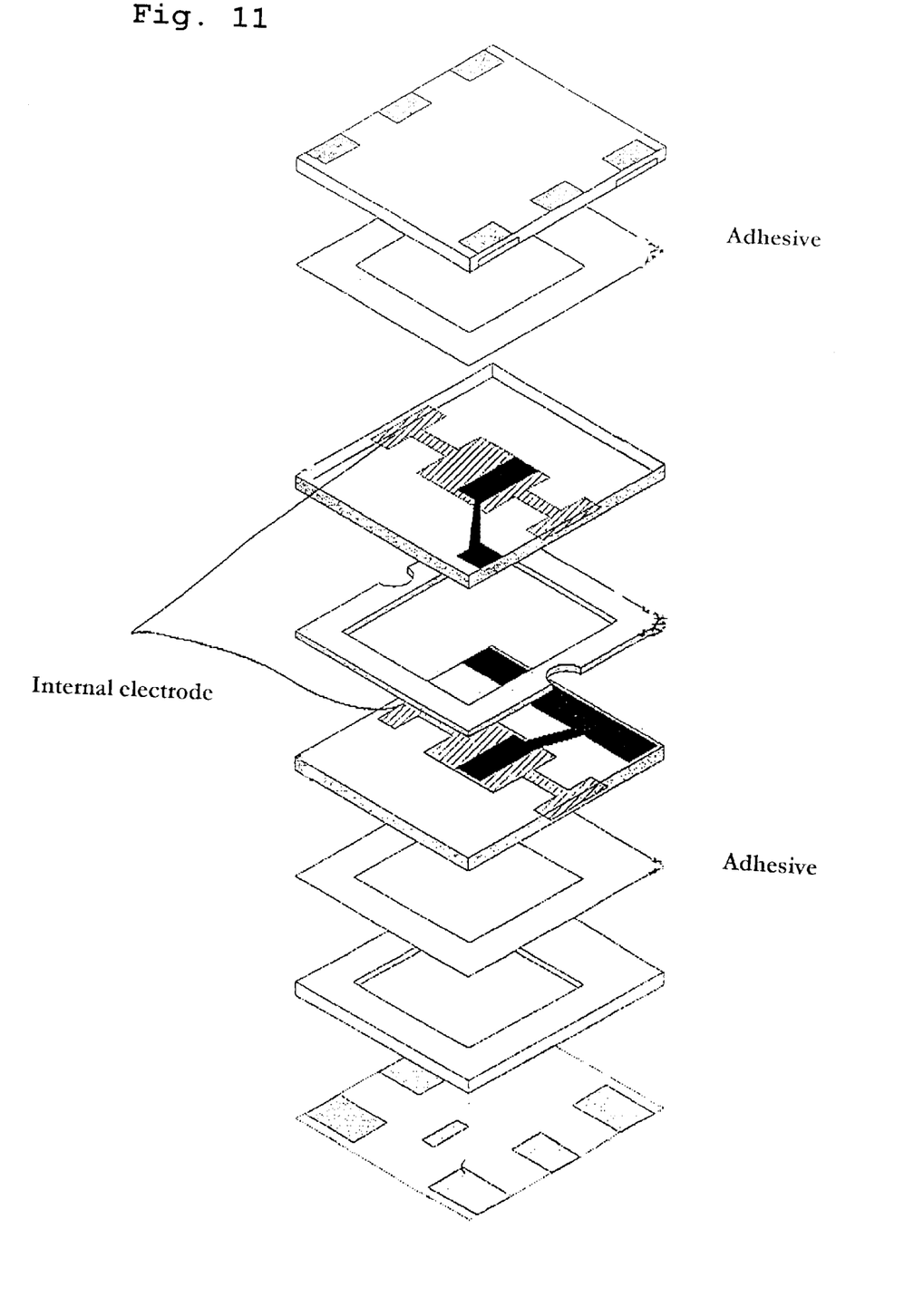
FIG. 11 is an exploded perspective view showing a piezoelectric filter device according to another preferred embodiment of the present invention including first and second piezoelectric filters laminated together to define an integral body.

FIG. 10 is a sectional view illustrating a conventional energy trap type piezoelectric filter device using a second harmonic wave of a thickness-extension vibration mode.

As shown in FIG. 10, a piezoelectric filter 51 including a piezoelectric substrate plate 52, which is polarized in its thickness direction, is provided. A ground electrode 53 is disposed in the center of the piezoelectric substrate plate 52. On the upper surface of the piezoelectric substrate plate 52, an input electrode 54 is arranged opposite to a portion of the ground electrode 53 with the piezoelectric substrate plate being partially interposed therebetween. On the bottom surface of the piezoelectric substrate plate 52, an output electrode 55 is provided. Similarly, the output electrode 55 is arranged opposite to a portion of the ground electrode 53 with the piezoelectric substrate plate being partially interposed therebetween. Further, the output electrode 55 is provided in a position so as not to overlap the input electrode 54 through the piezoelectric substrate plate 52.

Using the above structure, as soon as an input signal is applied between the input electrode 54 and the ground electrode 53, the piezoelectric filter 51 functions as a double mode filter that operates by virtue of a second harmonic wave of a thickness-extension vibration, thus producing an output signal through the output electrode 55.

Another conventional piezoelectric filter device includes two piezoelectric filters 51, and the two piezoelectric filters 51 are electrically connected to the ground potential via a relay capacitor.

However, in the above described conventional piezoelectric filter device, when the two piezoelectric filters 51 are electrically connected with each other through a relay capacitor, the height of the ground electrode 53 of one piezoelectric filter 51 is different from that of another ground electrode. As a result, it is difficult for the piezoelectric filter device to obtain consistent characteristics.

In the above piezoelectric filter 51, the ground electrode 53 is located at a central position in the thickness direction of the piezoelectric substrate plate 52. The piezoelectric filter 51 is usually obtained by cutting a mother piezoelectric substrate plate. However, in a mother piezoelectric substrate plate, it is impossible to avoid warpage and waviness.

Nevertheless, when a piezoelectric filter 51 produced via this method is tested, the height of the ground electrode 53 differs from one piezoelectric filter to another. As a result, in the above described conventional piezoelectric filter device in which the two piezoelectric filters 51 are electrically connected with each other via a relay capacity, the height of the ground electrode 53 of one piezoelectric filter 51 differs from that of another ground electrode. Accordingly, it is difficult to obtain consistent characteristics with this piezoelectric filter device.

SUMMARY OF THE INVENTION

In order to overcome the above-described problems, preferred embodiments of the present invention provide a piezoelectric filter device, which is free from the above-described defects existing in the above-described prior art. More particularly, preferred embodiments of the present invention provide an improved piezoelectric filter device which includes two energy trap type piezoelectric filters each having an ground electrode disposed within a piezoelectric substrate plate and operating using a second harmonic wave of a thickness-extension vibration, thereby producing an improved piezoelectric filter device having stabilized filter characteristics.

According to preferred embodiments of the present invention, a piezoelectric filter device operates using a second harmonic wave of a thickness-extension vibration mode and includes a first piezoelectric filter and a second piezoelectric filter which are electrically connected to each other with a relay capacitor interposed therebetween, the first and second piezoelectric filters are polarized in the thickness directions thereof and include a pair of mutually opposing piezoelectric substrate plates each having a first main surface and a second main surface, a ground electrode provided within each of the piezoelectric substrate plates, an input electrode provided on the first main surface of each piezoelectric substrate plate such that the input electrode is opposite to one portion of the ground electrode with the piezoelectric substrate plate being partially interposed therebetween, an output electrode provided on the second main surface of each piezoelectric substrate plate such that the output electrode is opposite to the ground electrode except in the one portion thereof, with the piezoelectric substrate plate being partially interposed therebetween.

When a distance between the first main surface of the first piezoelectric filter and the adjacent ground electrode is $ta_1$, a distance between the second main surface of the first filter and the adjacent ground electrode is $tb_1$, a distance between the second main surface of the second piezoelectric filter and the adjacent ground electrode is $ta_2$, a distance between the first main surface of the second piezoelectric filter and the adjacent ground electrode is $tb_2$, the thicknesses of the piezoelectric substrate plates of the first and second piezoelectric filters are T1 and T2 respectively, $tb_1-ta_1$ is 0 to 0.1 T1, $Tb_2-ta_2$ is 0 to 0.1 T2, alternatively, $tb_1-ta_1$ is −0.1 T1 to 0, $Tb_2-ta_2$ is 0.1 T2 to 0.

Preferably, the thicknesses T1 and T2 of the piezoelectric substrate plates of the first and second piezoelectric filters are substantially equal to each other.

Figure 1:
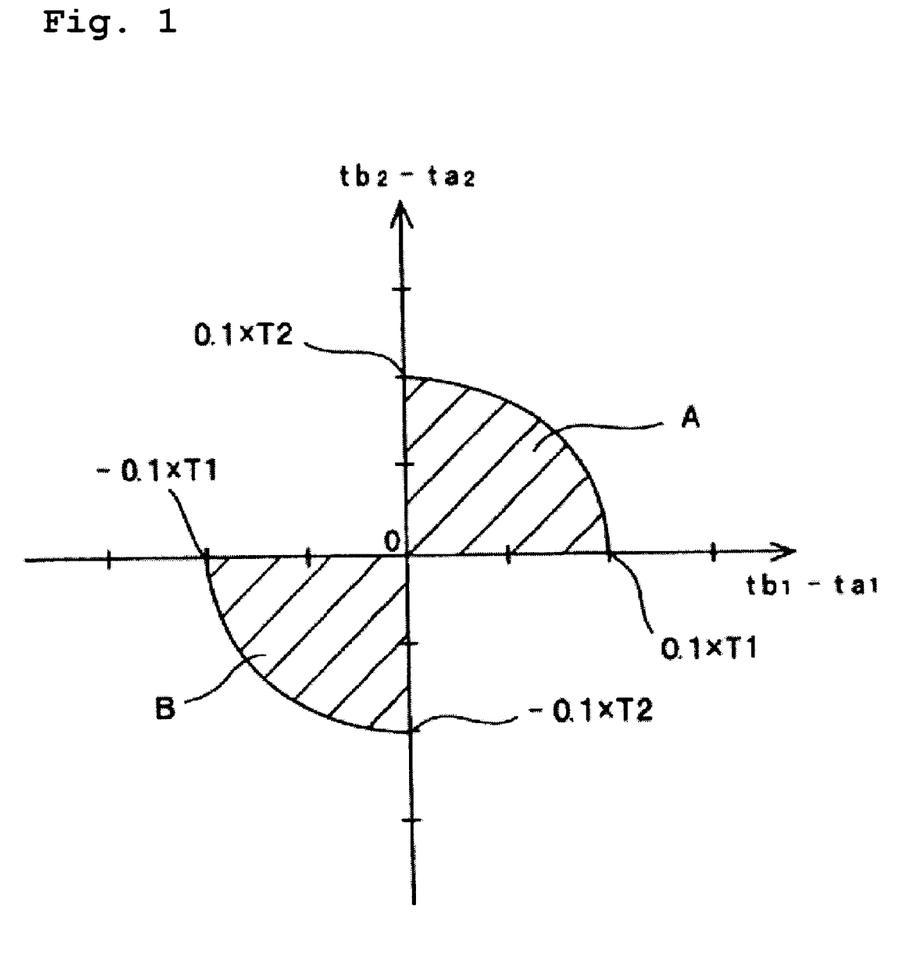
FIG. 1 is a graph illustrating a relationship between $tb_1-ta_1$ and $tb_2-ta_2$ in the piezoelectric filter device according to preferred embodiments of the present invention.

More preferably, when the thicknesses T1 and T2 of the piezoelectric substrate plates of the first and second piezoelectric filters are substantially equal to each other, and when the thicknesses are T, in a perpendicular coordinate system including $tb_1-ta_1$ and $tb_2-ta_2$, the value of $tb_1-ta_1$ and the value of $tb_2-ta_2$ will fall within either a range A or a range B as shown in FIG. 1.

Further, in the piezoelectric filter device according to preferred embodiments of the present invention, the first and second piezoelectric filters may either be formed separately, or they can be laminated together to define an integral body in a manner such that the vibrations of the piezoelectric vibration sections thereof are not suppressed.

Other features, elements, characteristics and advantages of the present invention will become more apparent from the following detailed description of preferred embodiments hereof with reference to the attached drawings.

DETAILED DESCRIPTION OF PREFERRED EMBODIMENTS

In the following, preferred embodiments of the present invention will be described in detail, so that the present invention may be made more understandable.

Figure 2:
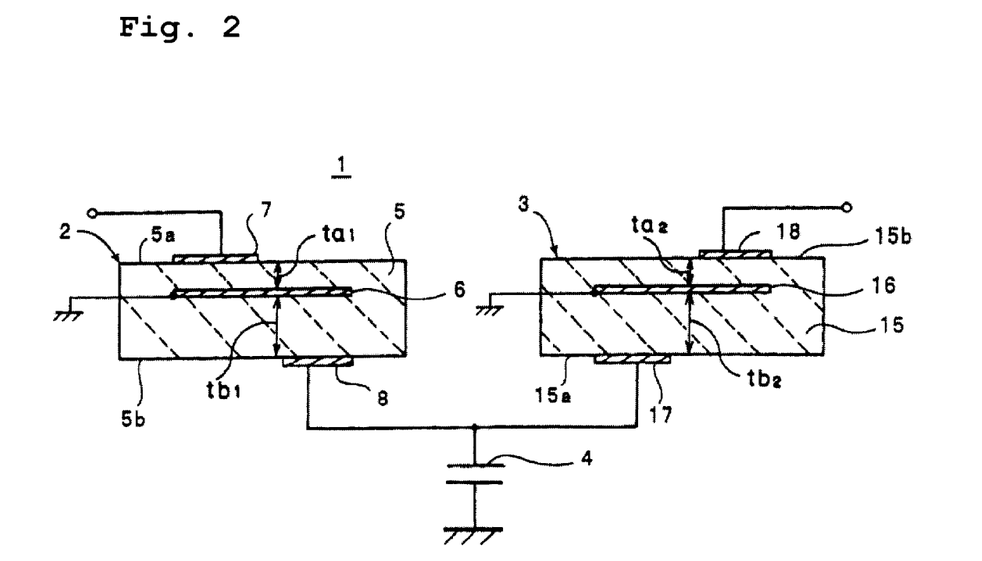
FIG. 2 is an explanatory view illustrating a piezoelectric filter device according to a preferred embodiment of the present invention.

FIG. 2 is an explanatory view illustrating a piezoelectric filter device according to one preferred embodiment of the present invention.

As shown in FIG. 2, the piezoelectric filter device 1 includes a first piezoelectric filter 2, a second piezoelectric filter 3 and a relay capacitor 4.

The first and second piezoelectric filters 2 and 3 constitute an energy trap type double mode piezoelectric filter that operates using a second harmonic wave of a thickness-extension vibration mode.

The first piezoelectric filter 2 includes a piezoelectric substrate plate 5. The piezoelectric substrate plate 5 is preferably made of a piezoelectric ceramic such as a lead titanate zirconate ceramic, or other suitable ceramic, the plate as a whole is then subjected to a polarization treatment conducted in the thickness direction thereof.

Further, within the piezoelectric substrate plate 5 a ground electrode 6 is arranged to be substantially parallel with both a first main surface 5a and a second main surface 5b of the plate 5. Moreover, on the first main surface 5a of the piezoelectric substrate plate 5, an input electrode 7 is provided. The input electrode 7 is located in a position to face a portion of the ground electrode 6, with part of the piezoelectric substrate plate 5 interposed therebetween.

An output electrode 8 is provided on the second main surface 5b of the piezoelectric substrate plate 5. The output electrode 8 is positioned to face the ground electrode 6 with part of the piezoelectric substrate plate 5 interposed therebetween. In particular, the output electrode 8 is arranged such that it does not face the input electrode 7 with the entire piezoelectric substrate plate 5 interposed therebetween.

The above ground electrode 6, the input electrode 7 and the output electrode 8 are preferably formed by applying an electrically conductive paste, followed by a baking treatment. Alternatively, they may be formed by virtue of a film formation technique using a vapor deposition method or a sputtering method, or other suitable method.

Figure 3:
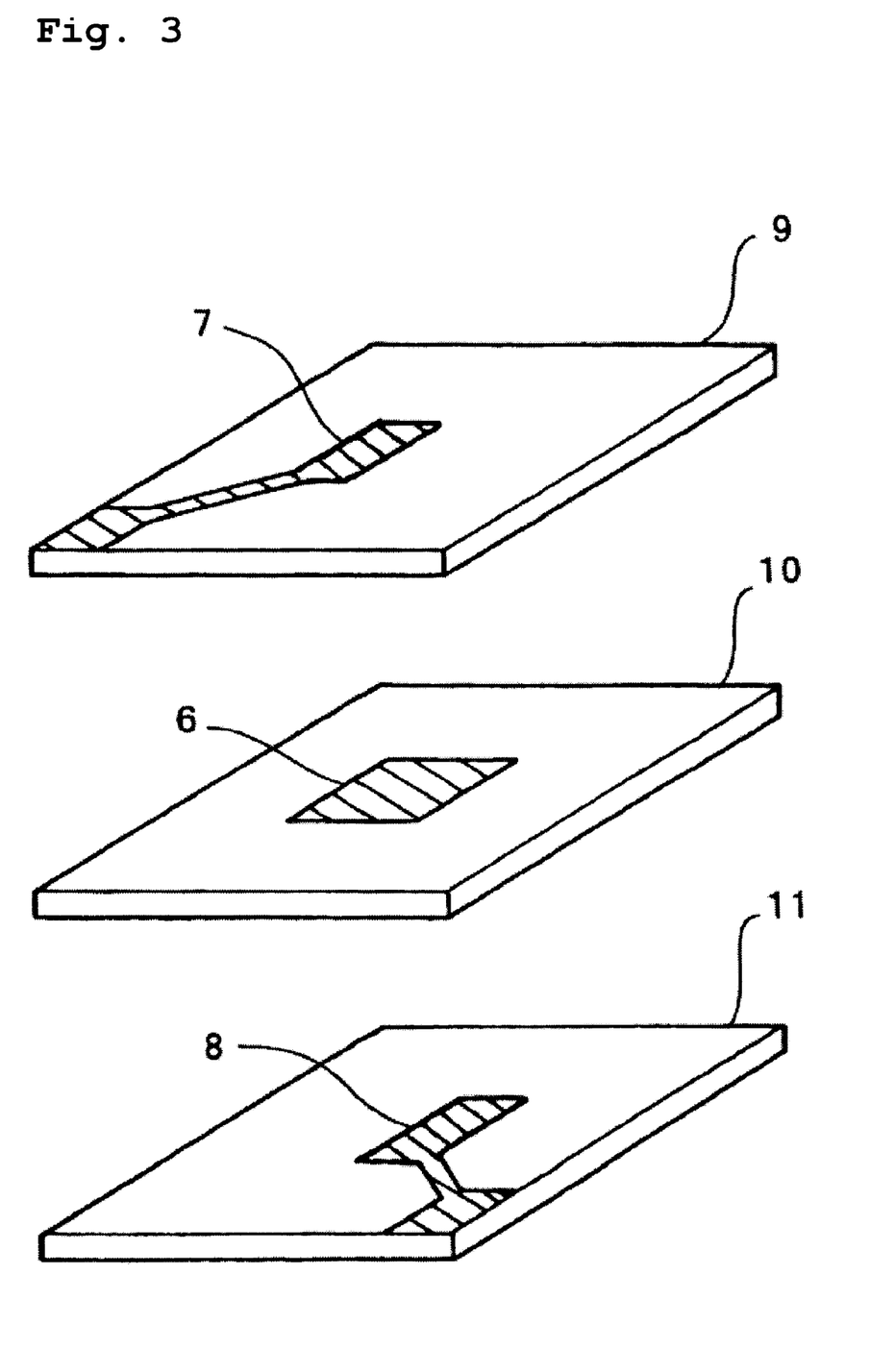
FIG. 3 is an exploded perspective view illustrating an electrode structure of a first piezoelectric filter of the piezoelectric filter device shown in FIG. 2.

As shown in FIG. 3, three green sheets 9 to 11 are prepared which include a piezoelectric ceramic. Then, the input electrode 7, the ground electrode 6 and the output electrode 8 are printed on the green sheets 9 to 11 by applying an electrically conductive paste thereon. Next, the green sheets 9 to 11 are laminated one upon another, and subjected to a pressing treatment in their thickness directions, followed by a baking treatment, thereby obtaining a piezoelectric filter 2.

However, in general, to obtain increased productivity, it is necessary to use mother green sheets. After several mother green sheets have been laminated one upon another, a laminated mother body is obtained. Then, the laminated mother body is baked and cut in a desired manner, to produce a number of piezoelectric filters 2.

The second piezoelectric filter 3 preferably has the same structure as the first piezoelectric filter 2. The second piezoelectric filter 3 has a piezoelectric substrate plate 15, a ground electrode 16 is provided within the piezoelectric plate 15. Further, an input electrode 17 is provided on a first main surface 15a of the piezoelectric substrate plate 15, and an output electrode 18 is provided on its second main surface 15b.

Moreover, the output electrode 8 of the first piezoelectric filter 2 and the input electrode 17 of the second piezoelectric filter 15 are electrically connected to each other, with the relay capacitor 4 being electrically connected between an electrical connecting point A and the ground potential.

The relay capacitor 4 is formed independent of the above structure including the first and second piezoelectric filters 2 and 3. Alternatively, the relay capacitor 4 may be formed integrally with either or both of the first and second piezoelectric filters 2 and 3.

In this way, the piezoelectric filter device 1 of the present preferred embodiment is characterized in that when a distance between the first main surface 5a of the first piezoelectric filter 2 and the ground electrode 6 is $ta_1$, a distance between the second main surface 5b of the first filter 2 and the ground electrode 6 is $tb_1$, a distance between the second main surface 15b of the second piezoelectric filter 3 and the ground electrode 16 is $ta_2$, a distance between the first main surface 15a of the second piezoelectric filter 3 and the ground electrode 16 is $tb_2$, the thicknesses of piezoelectric substrate plates 5 and 15 are T1 and T2 respectively, $tb_1-ta_1$ and $tb_2-ta_2$ are in the flowing ranges:

$tb_1-ta_1$ is 0 to 0.1 T1, $tb_2-ta_2$ is 0 to 0.1 t2.

Alternatively, $tb_1-ta_1$ is −0.1 T1 to 0, $Tb_2-ta_2$ is −0.1 T2 to 0.

Preferably, referring to FIG. 1, $tb_1-ta_1$ and $Tb_2-ta_2$ are within a range A or a range B.

In the piezoelectric filter 1 of the preferred present embodiment, since $tb_1-ta_1$ and $tb_2-ta_2$ are within the above ranges, the characteristics of one filter do not substantially differ from those of another. Alternatively, if $tb_1-ta_1$ and $tb_2-ta_2$ are not within the above ranges, it is impossible to obtain excellent filter characteristics.

To produce the piezoelectric filters 2 and 3, the piezoelectric substrate plates 5, 15 each having a size of approximately 3.0×3.0×0.35 mm are produced, the substrate plates being made of a ceramic of lead titanate zirconate. Further, in the first and second piezoelectric filters 2 and 3, each of the input electrode and the output electrode has an area of approximately 0.48 mm$^2$, each of the ground electrodes is configured in a strap configuration having a width of approximately 1.7 mm. The above first and second piezoelectric filters 2 and 3 are connected to the relay capacitor 4 having a capacitance of approximately 70 pF in a manner as shown in FIG. 2, thereby providing the piezoelectric filter device 1.

Moreover, several piezoelectric filter devices 1 were produced having different $tb_1-ta_1$ and $tb_2-ta_2$. The characteristics of each of the piezoelectric filter devices produced in this way are shown in FIGS. 4A and 4B to FIGS. 8A and 8B. The filter characteristics shown in FIGS. 4A and 4B to FIGS. 8A and 8B are set forth in the following Table 1 in which $tb_1-ta_1$ and $tb_2-ta_2$ are indicated. Further, in FIG. 4 to FIG. 8 each of dotted chain lines represents a group delay time.

Figure 4A:
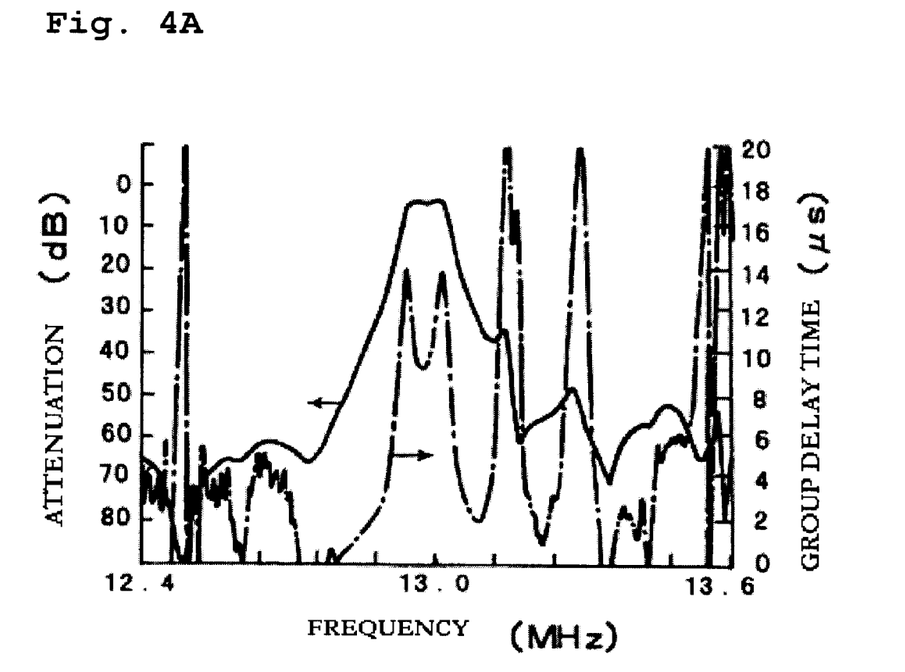
FIGS. 4A and 4B are graphs illustrating filter characteristics of a piezoelectric filter device according to an experimental example of preferred embodiments of the present invention.
Figure 4B:
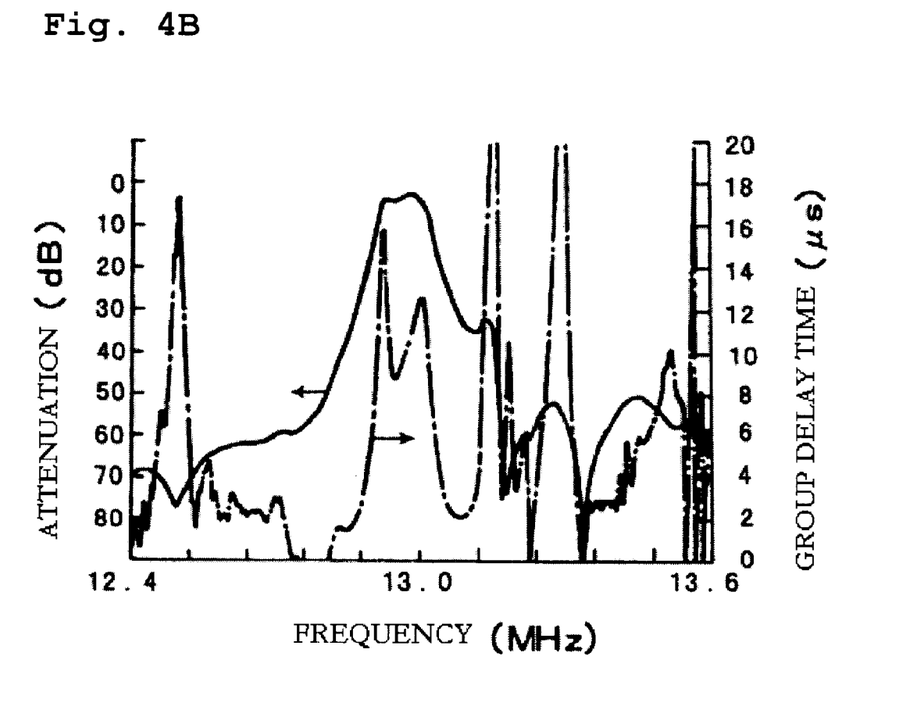
Figure 5A:
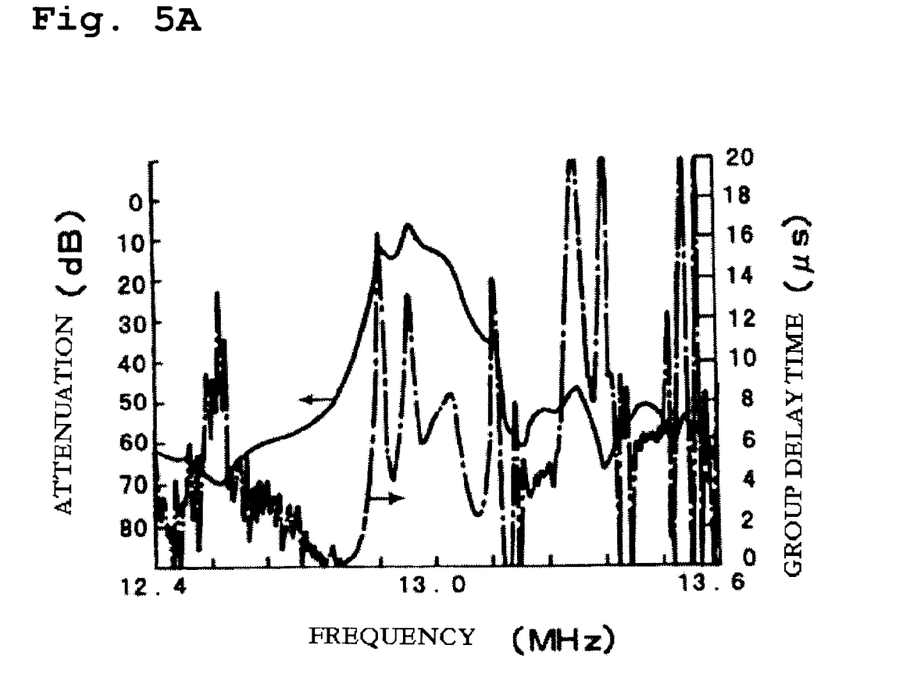
FIGS. 5A and 5B are graphs illustrating filter characteristics of another piezoelectric filter device according to an experimental example of preferred embodiments of the present invention.
Figure 5B:
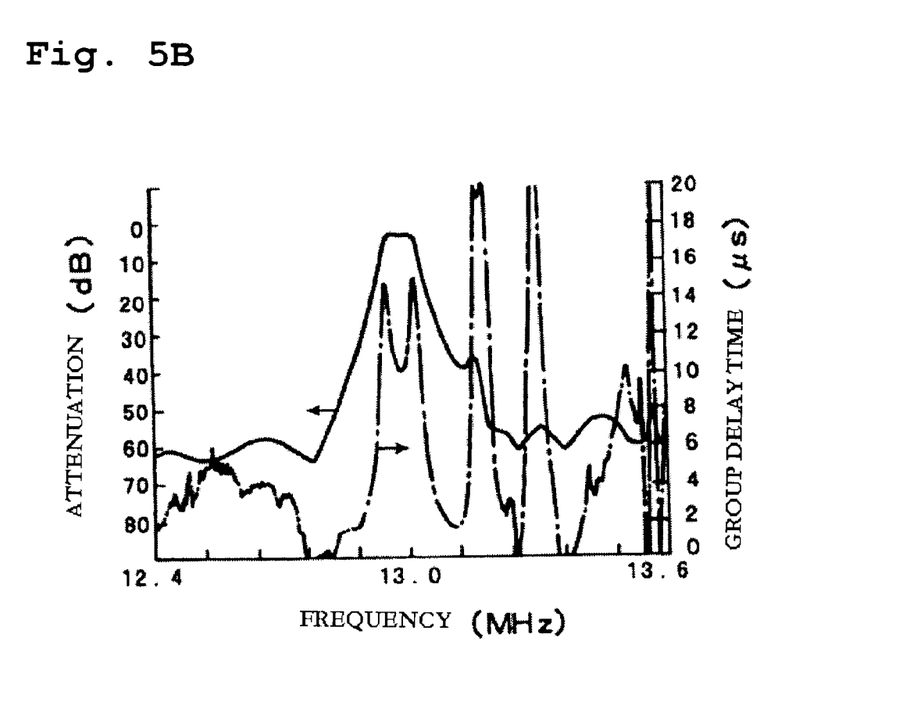
Figure 6A:
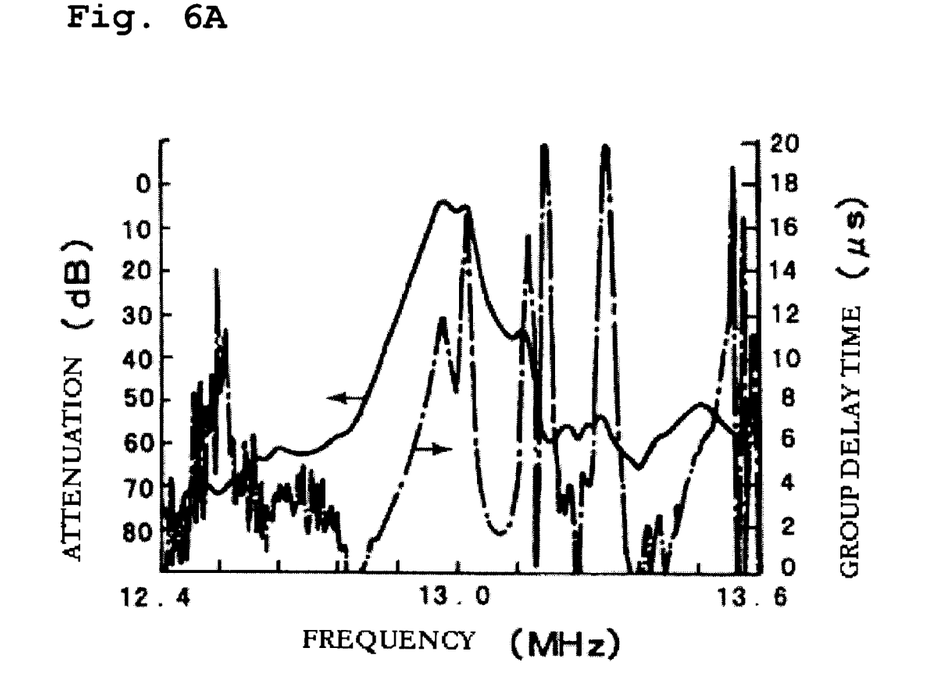
FIGS. 6A and 6B are graphs illustrating filter characteristics of another piezoelectric filter device according to an experimental example of preferred embodiments of the present invention.
Figure 6B:
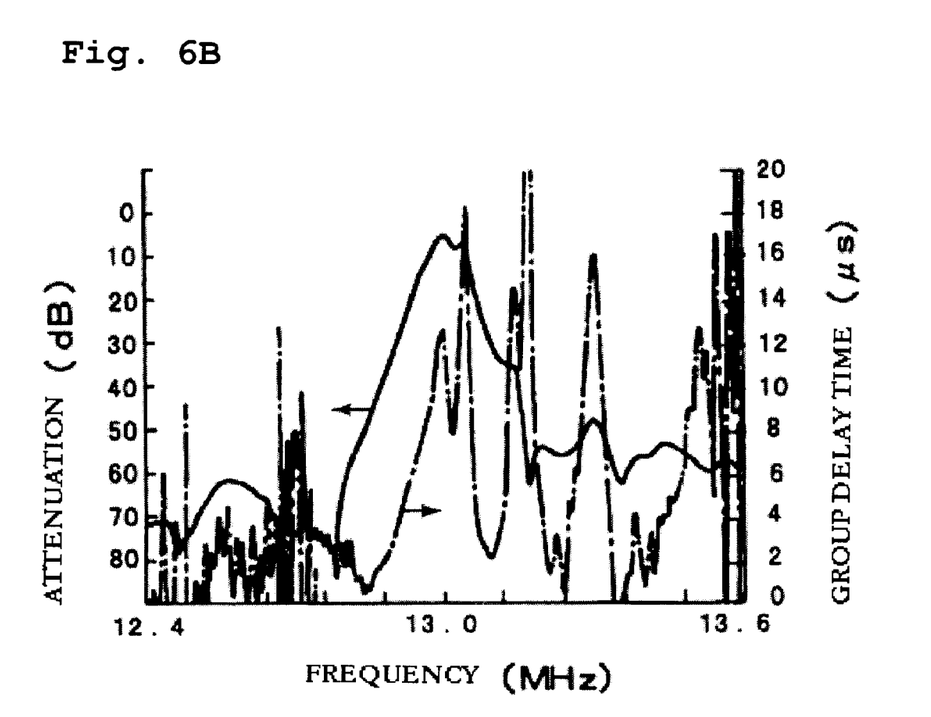
Figure 7A:
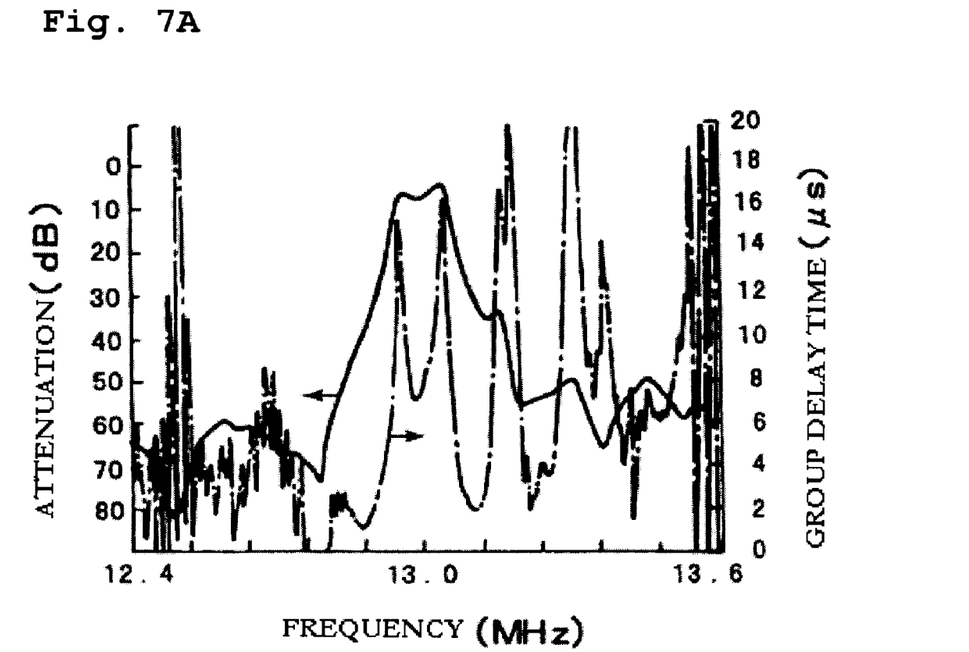
FIGS. 7A and 7B are graphs illustrating filter characteristics of another piezoelectric filter device according to an experimental example of preferred embodiments of the present invention.
Figure 7B:
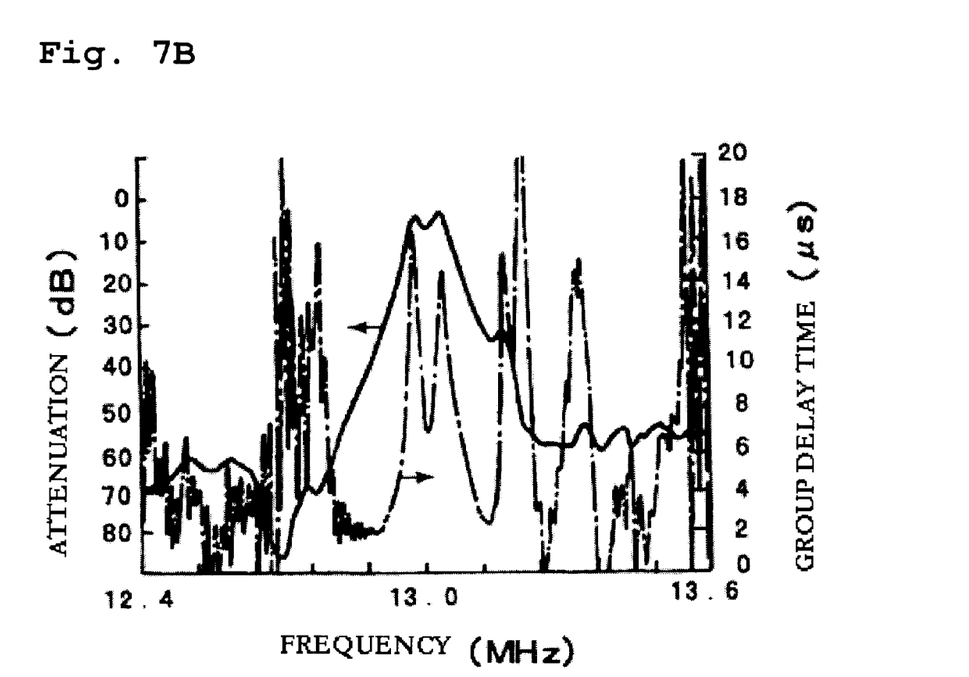
Figure 8A:
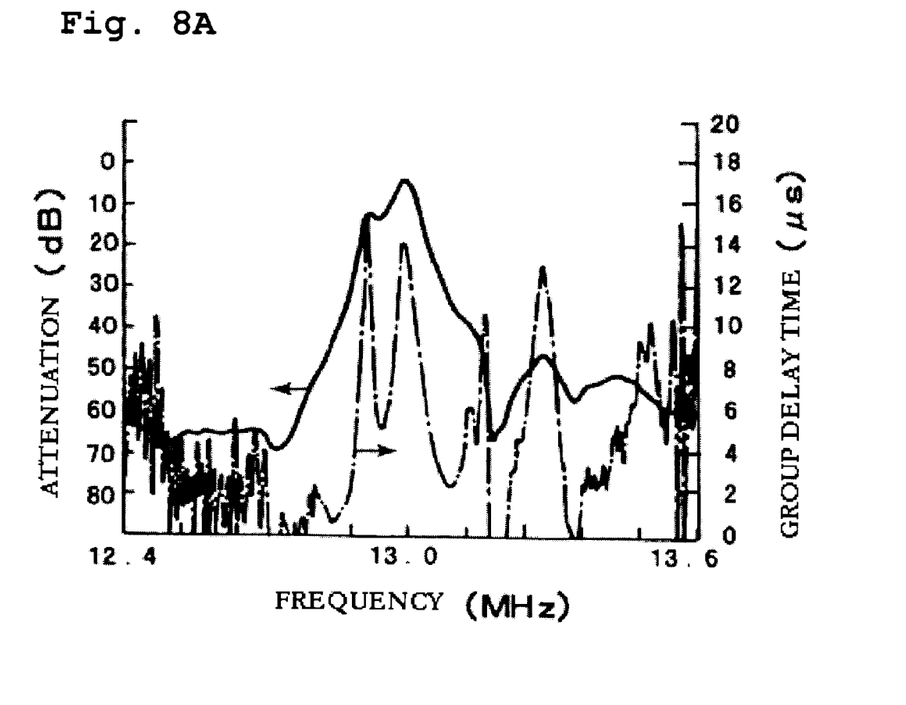
FIGS. 8A and 8B are graphs illustrating filter characteristics of another piezoelectric filter device according to an experimental example of preferred embodiments of the present invention.
Figure 8B:
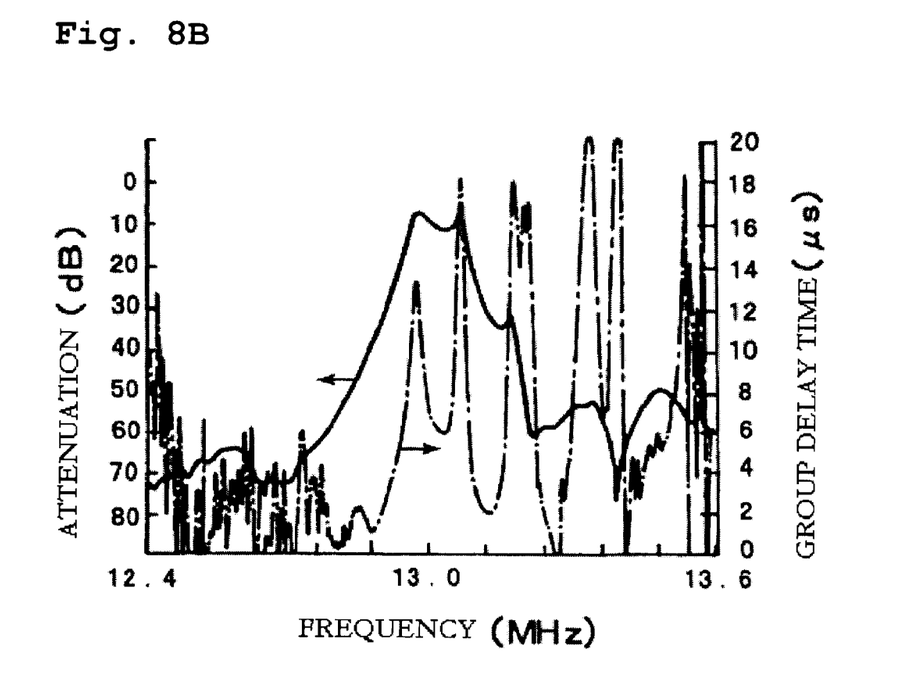
Figure 9:
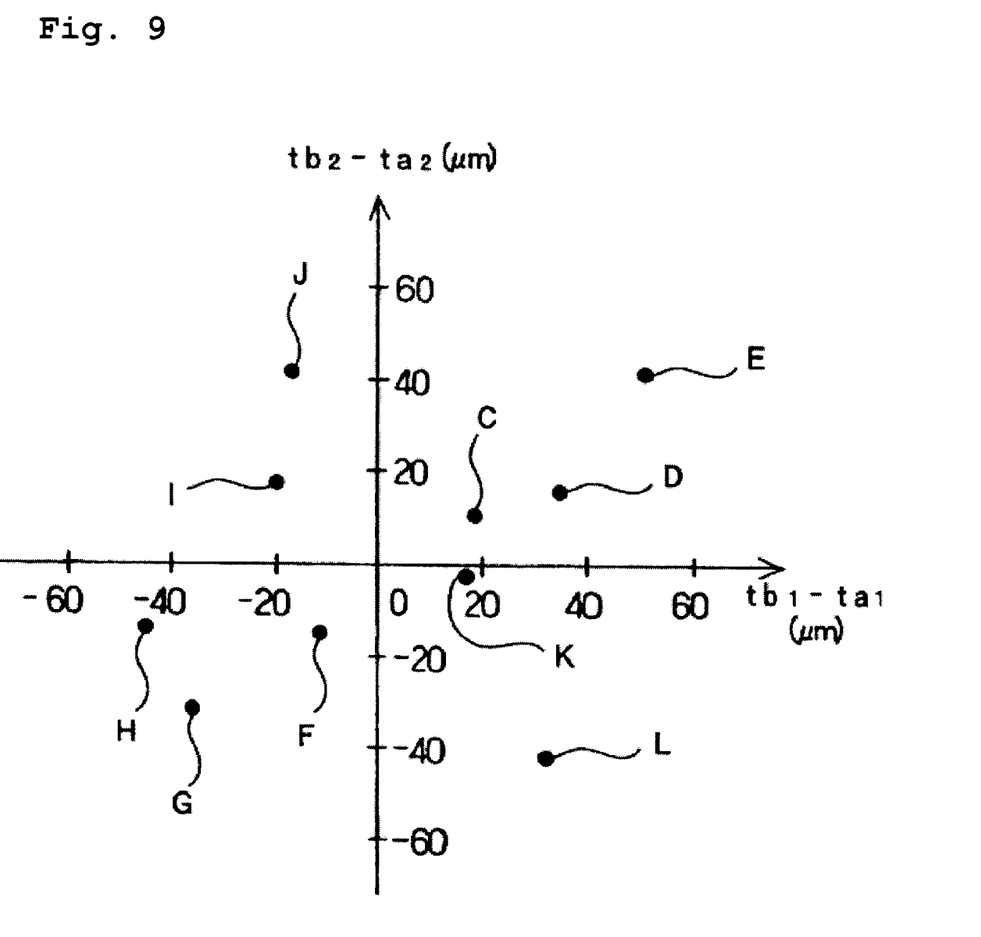
FIG. 9 is a graph illustrating a relationship between $tb_1-ta_1$ and $tb_2-ta_2$ in the piezoelectric filter devices according to the experimental examples of preferred embodiments of the present invention.

| Table 1 Points in FIG. 9 | Filter characteristic | $tb_1 - ta_1$ | $tb_2 - ta_2$ |
|---|---|---|---|
| C | FIG. 4A | 17 | 12 |
| D | FIG. 4B | 36 | 17 |
| E | FIG. 5A | 51 | 42 |
| F | FIG. 5B | −11 | −14 |
| G | FIG. 6A | −36 | −32 |
| H | FIG. 6B | −45 | −13 |
| I | FIG. 7A | −19 | 18 |
| J | FIG. 7B | −17 | 42 |
| K | FIG. 8A | 17 | −2 |
| L | FIG. 8B | 32 | −42 |

(Unit: μm)

In addition, the positions of $tb_1-ta_1$ and $tb_2-ta_2$ of each of the above piezoelectric filter devices are plotted on a perpendicular coordinate system of FIG. 9, with the horizontal axis representing $tb_1-ta_1$ and the vertical axis representing $tb_2-ta_2$.

As understood from FIG. 4 to FIG. 9, when $tb_1-ta_1$ is within a specifically defined range, it is possible to obtain excellent filter characteristics. On the other hand, when $tb_1-ta_1$ is not within the specifically defined range, a ripple phenomenon occurs in a band pass area.

However, although in the above experiment the thicknesses T1 and T2 of the piezoelectric substrate plates 5 and 15 of the first and second piezoelectric filters 2 and 3 are preferably substantially equal to each other, the thicknesses T1 and T2 may also be different from each other.

Further, although in the above experiment, the piezoelectric filters 2 and 3 are produced separately, and the relay capacitor 4 is electrically connected between the two filters, the first and second piezoelectric filters 2 and 3 may also be laminated together so as to form an integral structure. At this time, the relay capacitor 4 may be formed by providing a pair of mutually opposing electrodes on two piezoelectric substrate plates defining the first and second piezoelectric filters 2 and 3.

Moreover, in the piezoelectric filter devices according to preferred embodiments of the present invention, since the values of $tb_1-ta_1$ and $tb_2-ta_2$ are set to be within the above specifically defined ranges, stabilized characteristics for the filter devices are obtained. More particularly, since each piezoelectric filter device functions by virtue of a second harmonic wave of a thickness-extension vibration mode and includes a first piezoelectric filter and a second piezoelectric filter both of which are electrically connected to each other with a relay capacitor interposed therebetween, many filter devices having characteristics do not substantially differ from one another are produced.

In particular, when the thicknesses T1 and T2 of the piezoelectric substrate plates of the first and second piezoelectric filters are substantially equal to each other, and when the thickness is T, in an orthogonal coordinate system including $tb_1-ta_1$ and $tb_2-ta_2$, the values of $tb_1-ta_1$ and $Tb_2-ta_2$ fall within either a range A or a range B in FIG. 1. In this way, each filter device obtains further stabilized characteristics.

Further, in the piezoelectric filter device according to preferred embodiments of the present invention, since the first and second piezoelectric filters may be laminated together to define an integral body in a manner such that the vibrations of piezoelectric vibration sections thereof are not suppressed, a greatly improved piezoelectric filter device which has stabilized filter characteristics and is compact in size is provided.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A piezoelectric filter device which operates by using a second harmonic wave of a thickness-extension vibration mode comprising:
   a first piezoelectric filter and a second piezoelectric filter electrically connected to each other;
   a relay capacitor interposed between said first piezoelectric filter and said second piezoelectric filter, the first and second piezoelectric filters being polarized in their thickness directions, each of the first and second piezoelectric filters including:
   a pair of mutually opposing piezoelectric substrate plates each having a first main surface and a second main surface;
   a ground electrode provided between the piezoelectric substrate plates;
   an input electrode provided on the first main surface of one of the piezoelectric substrate plates such that said input electrode is opposite to one portion of the ground electrode with said one of the piezoelectric substrate plates partially interposed between said input electrode and said ground electrode;
   an output electrode provided on the second main surface of the other piezoelectric substrate plate such that said output electrode is opposite to the ground electrode in a portion other than said one portion thereof, with said other of the piezoelectric substrate plates partially interposed between said output electrode and said ground electrode; wherein
   a distance between the first main surface of the first piezoelectric filter and the adjacent ground electrode is $ta_1$, a distance between the second main surface of the first filter and the adjacent ground electrode is $tb_1$, a distance between the second main surface of the second piezoelectric filter and the adjacent ground electrode is $ta_2$, a distance between the first main surface of the second piezoelectric filter and the adjacent ground electrode is $tb_2$, the thicknesses of the piezoelectric substrate plates of the first and second piezoelectric filters are T1 and T2, respectively, such that $0<tb_1-ta_1 \leqq 0.1 \times T1$, $0<tb_2-ta_2 \leqq 0.1 \times T2$, or $-0.1 \times T1 \leqq tb_1-ta_1<0$, $-0.1 \times T2 \leqq tb_2-ta_2<0$.

2. The piezoelectric filter device according to claim 1, wherein the thicknesses T1 and T2 of the piezoelectric substrate plates of the first and second piezoelectric filters are substantially equal to each other.

3. The piezoelectric filter device according to claim 2, wherein the first and second piezoelectric filters are laminated together to define an integral body such that vibrations of the first and second piezoelectric filters are not suppressed.

4. The piezoelectric filter device according to claim 1, wherein said pair of piezoelectric substrate plates are made of PZT.

5. The piezoelectric filter device according to claim 1, wherein the first and second piezoelectric filters are laminated together to define an integral body such that the vibrations of the first and second piezoelectric filters are not suppressed.

6. The piezoelectric filter device according to claim 1, wherein said pair of piezoelectric substrate plates are made of piezoelectric ceramic.

7. The piezoelectric filter device according to claim 1, wherein the pair of piezoelectric substrate plates have a size of approximately 3.0 mm×3.0 mm×0.35 mm.

8. The piezoelectric filter device according to claim 1, wherein the input and output electrodes each have an area of approximately 0.48 mm².

9. The piezoelectric filter device according to claim 1, wherein said ground electrode has a strap configuration.

10. The piezoelectric filter device according to claim 9, wherein said strap configuration has a width of approximately 1.7 mm.

11. The piezoelectric filter device according to claim 1, wherein said relay capacitor has a capacitance of approximately 70 pF.

12. A piezoelectric filter device comprising:
a first piezoelectric filter including a first piezoelectric substrate plate having first and second main surfaces, a ground electrode provided within the first piezoelectric substrate plate;
a second piezoelectric filter including a second piezoelectric substrate plate having first and second main surfaces, a ground electrode provided within the second piezoelectric substrate plate;
a relay capacitor interposed between said first piezoelectric filter and said second piezoelectric filter;
an input electrode provided on the first main surface of each of the first and second piezoelectric substrate plates such that said input electrode is opposite to one portion of the ground electrode with one of the piezoelectric substrate plates partially interposed between said input electrode and said ground electrode;
an output electrode provided on the second main surface of each of the first and second piezoelectric substrate plate such that said output electrode is opposite to the ground electrode in a portion other than said one portion thereof, with one of the piezoelectric substrate plates partially interposed between said output electrode and said ground electrode; wherein
a distance between the first main surface of the first piezoelectric filter and the adjacent ground electrode is $ta_1$, a distance between the second main surface of the first filter and the adjacent ground electrode is $tb_1$, a distance between the second main surface of the second piezoelectric filter and the adjacent ground electrode is $ta_2$, a distance between the first main surface of the second piezoelectric filter and the adjacent ground electrode is $tb_2$, the thicknesses of the piezoelectric substrate plates of the first and second piezoelectric filters are T1 and T2, respectively, such that $0<tb_1-ta_1 \leqq 0.1 \times T1$, $0<tb_2-ta_2 \leqq 0.1 \times T2$, or $-0.1 \times T1 \leqq tb_1-ta_1<0$, $-0.1 \times T2 \leqq tb_2-ta_2<0$.

13. The piezoelectric filter device according to claim 12, wherein the piezoelectric filter device is configured to operate in a second harmonic wave of a thickness-extension vibration mode.

14. The piezoelectric filter device according to claim 12, wherein the first and second piezoelectric filters are polarized in the thickness directions thereof.

15. The piezoelectric filter device according to claim 12, wherein the thicknesses T1 and T2 of the piezoelectric substrate plates of the first and second piezoelectric filters are substantially equal to each other.

16. The piezoelectric filter device according to claim 15, wherein the first and second piezoelectric filters are laminated together to define an integral body such that vibrations of the first and second piezoelectric filters are not suppressed.

17. The piezoelectric filter device according to claim 12, wherein the first and second piezoelectric filters are laminated together to define an integral body such that the vibrations of the first and second piezoelectric filters are not suppressed.

* * * * *